United States Patent
Fischer et al.

(10) Patent No.: US 6,205,218 B1
(45) Date of Patent: *Mar. 20, 2001

(54) EXTENDED FEEDBACK CIRCUIT FOR IMPEDANCE MATCHING AND VOLTAGE ISOLATION

(75) Inventors: Jonathan Herman Fischer, Blandon; Donald Raymond Laturell, Allentown, both of PA (US)

(73) Assignee: Lucent Technologies, Inc., Murray Hill, NJ (US)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 08/847,827

(22) Filed: Apr. 28, 1997

(51) Int. Cl.[7] .................................................. H04M 1/00
(52) U.S. Cl. ............................ 379/403; 379/398; 379/345
(58) Field of Search ..................................... 379/398, 399, 379/403, 405, 391, 395, 345

(56) References Cited

U.S. PATENT DOCUMENTS

| | | | |
|---|---|---|---|
| 4,278,848 | * 7/1981 | Rizzo et al. | 379/403 |
| 4,302,636 | * 11/1981 | Dumont et al. | 379/405 |
| 5,280,526 | 1/1994 | Laturell | 379/405 |
| 5,329,585 | * 7/1994 | Suzak et al. | 379/399 |
| 5,500,895 | * 3/1996 | Yurgelites | 379/412 |
| 5,528,685 | 6/1996 | Cwynar et al. | 379/405 |
| 5,528,686 | * 6/1996 | Cwynar et al. | 379/405 |
| 5,574,749 | * 11/1996 | Nelson et al. | 375/220 |

OTHER PUBLICATIONS

Electronic Communications Technology, James K. Hardy, 1986, p. 67, Prentice–Hall International Editions, 1986.*

* cited by examiner

Primary Examiner—N. Le
Assistant Examiner—Shih-Wen Hsieh
(74) Attorney, Agent, or Firm—Gibbons, Del Deo, Dolan, Griffinger & Vecchione

(57) ABSTRACT

A network interface circuit employs an extended feedback circuit topology for impedance matching across a high voltage boundary between a line side portion and low voltage portion of a network. The network interface circuit includes an operational amplifier-based circuit which is responsive to a signal applied from user equipment on the low voltage portion. Specifically, the present invention includes a transmit path having a first, second, and third amplifier circuit and an impedance element, and a receive path that includes a transfer function implemented as a second order low pass filter for correcting amplifier gain and phase effects in the complex feedback loop of the circuit. The output impedance is remotely set by multiplying the impedance element by a scale factor to match the network impedance. The feedback loop is extended across the high voltage boundary using high voltage interfaces such as linear optical coupling devices (LOCs).

25 Claims, 3 Drawing Sheets

EXTENDED FEEDBACK CIRCUIT FOR IMPEDANCE MATCHING AND VOLTAGE ISOLATION

FIELD OF THE INVENTION

This invention relates generally to the field of telecommunications networks, and more particularly, to a network interface circuit which uses an extended feedback circuit for impedance matching and voltage isolation between a low voltage side and a line side of a network.

BACKGROUND OF THE INVENTION

Telephone network interface circuits (i.e., data access arrangements (DAAs)) for international applications require high voltage isolation and compliance with various country-specific parameters. The technical specifications for network connections vary widely in different countries and are intended for the protection of the network from harms caused by connections of terminal equipment thereto. Accordingly, telephone network interface applications require DAA-type solutions capable of high voltage isolation with flexibility to accommodate stricter and more varied performance requirements.

There are many considerations that must be taken into account when connecting terminal equipment to the telephone network. For example, hazardous voltages and currents placed on the telephone lines by customer equipment can damage central office equipment or injure personnel. Additionally, signal levels must be maintained within certain maximum limits in order to prevent overloading and cross talk. Compliance with specified on-hook impedances is also required because the central office must evaluate line conditions, and the on-hook impedances must also be sufficient to drive the telephone ringer. Balance of the line, referred to as impedance matching, is also important because impedance mismatch will produce hum and cross talk. Finally, certain time delays and the absence of signals on certain prescribed signaling frequencies are required in order to address the concerns of local operating companies about billing protection.

Figure 1:
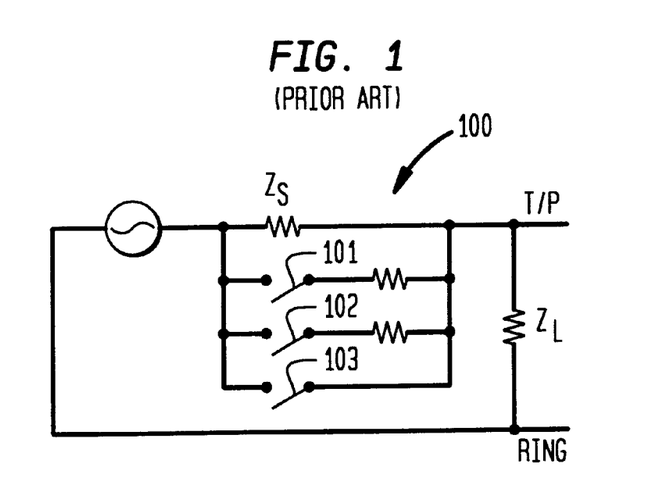
FIG. 1 is a schematic of a prior art circuit arrangement employing high voltage switches to provide impedance matching.

FIG. 1 depicts a prior art circuit 100 for interfacing end user terminal equipment to the telephone network. A load impedance $Z_L$ represents the specific impedance parameters of the telephone network. High voltage isolated switches 101, 102, and 103 are connected across and are programmed in combination with a transmission impedance $Z_S$ to provide the required impedance match to $Z_L$. A disadvantage of using prior art circuit 100 in international markets is that a parallel array of a large number of high voltage isolated switches is needed to generate a reasonable image match (i.e., impedance match between a user side and a line side of the network) to meet the needs of several countries, each having their own country-specific parameters, such as return loss requirements. These high voltage isolated switches are expensive, and, if present in sufficient numbers, will make a network interface circuit too large to be practical where cost, size, and programmability are paramount concerns. Accordingly, there is a need to provide a simplified network interface that eliminates the extra high voltage isolated switches required for programming the network specific parameters.

Figure 2:
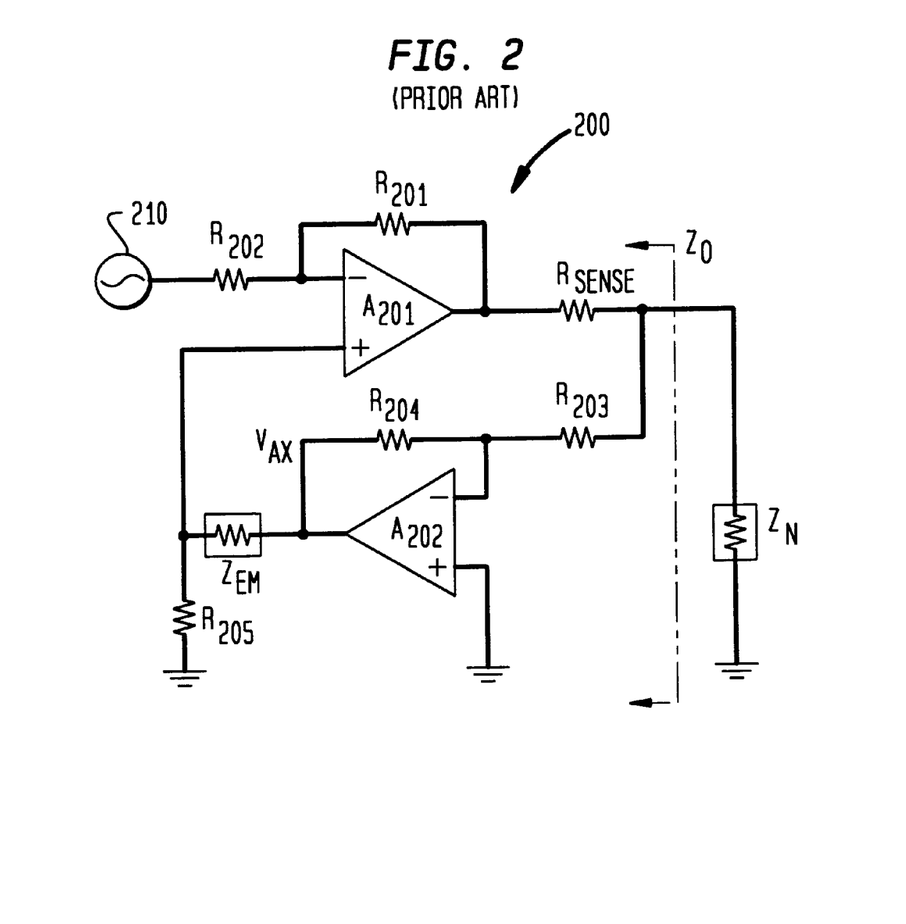
FIG. 2 is a schematic of a prior art, operational amplifier-based circuit arrangement for matching network impedance.

FIG. 2 shows another prior art circuit 200 which is intended to produce an output impedance $Z_O$ to match a line side impedance $Z_N$ of a network. Circuit 200 includes a transmit path having an operational amplifier circuit $A_{201}$, and a feedback path that includes an operational amplifier circuit $A_{202}$ and an emulation impedance $Z_{EM}$. The operational amplifier circuit $A_{201}$ provides a gain of a voltage signal applied from signal source 210. Using standard circuit analysis techniques, $Z_O$ of circuit 200 is defined as:

$$Z_0 = \frac{(R_{205} + Z_{EM})R_{SENSE}}{(K+1)R_{205} + Z_{EM}}, \text{ where } K = \left(1 + \frac{R_{201}}{R_{202}}\right)\left(\frac{R_{204}}{R_{203}}\right). \quad \text{(Equation 1)}$$

A proper selection of $Z_{EM}$ in circuit 200 is intended to set $Z_O$ to match the impedance of $Z_N$. However, as one skilled in the art will realize from equation 1, $Z_{EM}$ is not easily separable from the other scaling terms (i.e., the other circuit elements (e.g., resistors) which scale $Z_{EM}$). More specifically, $Z_O$ cannot be isolated into an impedance term (i.e., $Z_{EM}$) and a separately distinguishable scale term. As such, circuit 200 suffers the disadvantage of having poor control of the output impedance $Z_O$, because $Z_{EM}$ cannot be effectively scaled in a practical manner. Consequently, while circuit 200 is intended to provide an impedance match to $Z_N$, this objective is frustrated by the difficulty in scaling $Z_{EM}$ to set $Z_O$. Moreover, circuit 200 also suffers the disadvantage of not having voltage isolation between the line side and the low voltage side to protect against hazardous voltages and currents. Therefore, circuit 200 does not provide a practical solution for impedance emulation across a high voltage boundary.

Although other efforts have been made to address impedance emulation in a network interface context using amplifier-based circuits, these efforts have not been successful for several reasons. Among these reasons is that the prior art circuit topologies have not solved the noise problems associated with frequency-related amplifier effects. Accordingly, there is still a critical need for a simplified and less costly network interface that provides both impedance matching and voltage isolation between the line side and low voltage side of a network without using expensive high voltage isolation switches and the like.

SUMMARY OF THE INVENTION

These and other aspects of the invention may be obtained generally in a network interface circuit that uses extended feedback to emulate the required AC and DC parameters for impedance matching between a low voltage side and a line side of a network.

According to one exemplary embodiment of the present invention, the network interface circuit includes a transmit path having a first, second, and third amplifier circuit and an impedance element, and a receive path that includes a transfer function in an extended feedback loop for correcting amplifier gain and phase effects. In this circuit arrangement, the output impedance is set by the impedance element multiplied by a clearly delineated scale factor. As such, the output impedance can be effectively controlled to match the network impedance by properly scaling the emulation impedance. Moreover, the transfer function corrects for noise problems associated with amplifier gain and phase effects by attenuating the signal and/or correcting the excess phase shift.

In an alternate embodiment, impedance matching is provided across a high voltage boundary. The transfer function includes an amplifier circuit providing a second order low pass function and the feedback path is extended across the high voltage boundary using linear optical coupling devices (LOCs). The LOCs provide the necessary voltage isolation and protection of the low voltage side from the line side of the network.

By using an extended feedback circuit topology to match the network impedance across a high voltage boundary, the present invention overcomes the shortcomings of the prior art circuits. Specifically, impedance matching is achieved without using costly high voltage switches, and effective impedance emulation is provided across a voltage isolation barrier between the line side and low voltage side of the network.

BRIEF DESCRIPTION OF THE DRAWINGS

A more complete understanding of the present invention may be obtained from consideration of the detailed description of the invention in conjunction with the drawings, with like elements referred to with like references, in which.

DETAILED DESCRIPTION OF THE INVENTION

As discussed below in more detail and in accordance with an embodiment of the invention shown in FIG. 3, a network interface circuit 300 includes a transmit path 301 and a receive path 302. The transmit path 301 includes a first amplifier circuit 311 to provide gain for a transmit voltage signal $V_{TX}$ applied from user equipment on a low voltage side. An emulation impedance $Z_5$ is coupled between the first amplifier circuit 311 and a second amplifier circuit 312. A third amplifier circuit 313 is coupled between the second amplifier circuit 312 and a variable current device $Q_1$. The receive path 302 provides an extended feedback path from $Q_1$ to the first amplifier circuit 311. The receive path 302 includes a transfer function F(s) 310 which corrects for amplitude and phase effects of the first, second, and third amplifier circuits 311, 312, and 313 respectively. More specifically, the transfer function F(s) 310 corrects for noise problems associated with amplifier gain and phase effects by attenuating the signal and/or correcting the excess phase shift. Using the topology of circuit 300, $Z_5$ can be scaled effectively to set $Z_O$ to match the line side impedance of the network. Additionally, as discussed below in more detail and in accordance with an alternative embodiment of the invention shown in FIG. 4, impedance emulation is provided across a high voltage boundary using a first high voltage interface 405 in a transmit path 403 and a second high voltage interface 406 in a receive path 404. The first and second high voltage interfaces, 405 and 406 respectively, jointly define a high voltage isolation barrier which separates a protected low voltage portion 401 and an unprotected line side portion 402 of the network.

Figure 3:
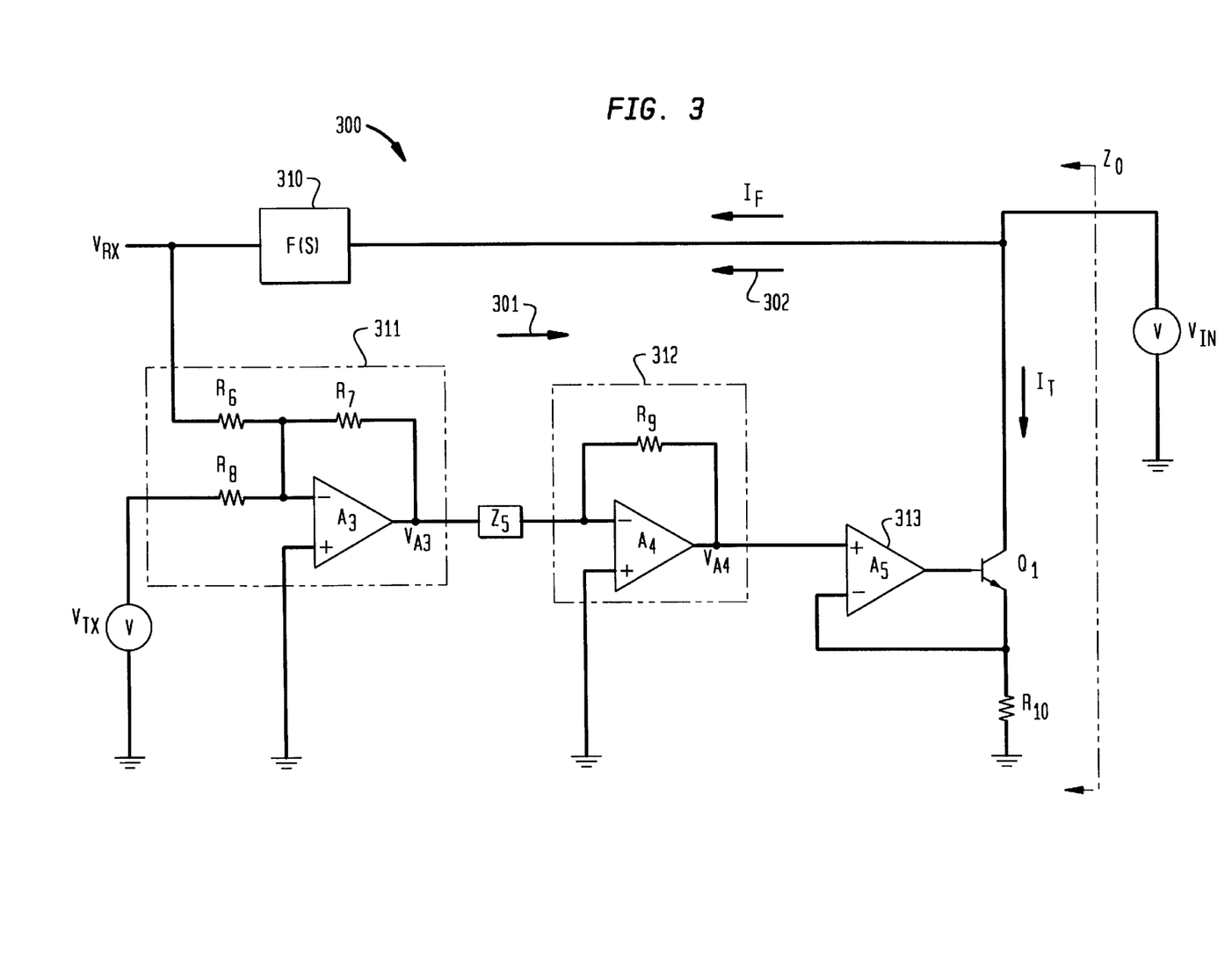
FIG. 3 is a schematic of an exemplary embodiment of the present invention utilizing operational amplifier-based circuits in conjunction with a transfer function in an extended feedback path to provide impedance matching to an interconnected network.

In more detail, the first amplifier circuit 311 of circuit 300 in FIG. 3 includes a first operational amplifier $A_3$, a first resistor $R_8$ coupled between an inverting input terminal of $A_3$ and the transmit voltage signal $V_{TX}$, a second resistor $R_7$ coupled between the inverting input terminal and an output terminal of $A_3$, and a third resistor $R_6$ coupled to the inverting input terminal of $A_3$. The emulation impedance $Z_5$ is coupled between the output terminal of $A_3$ and an inverting input terminal of a second operational amplifier $A_4$ in the second amplifier circuit 312. A resistor $R_9$ is coupled between the inverting input terminal and an output terminal of $A_4$. The third amplifier circuit 313 comprises a third operational amplifier $A_5$, which includes a non-inverting input terminal coupled to the output terminal of $A_4$, to provide gain for the signal from $A_4$. An inverting input terminal of $A_5$ is coupled to a junction between variable current device $Q_1$ and a resistor $R_{10}$. The variable current device $Q_1$ is responsive to a transmit signal from an output terminal of $A_5$. As shown, $V_{TX}$, $R_{10}$, and non-inverting input terminals of $A_3$ and $A_4$ are coupled to ground.

In the embodiment shown in FIG. 3, $Q_1$ can be a bipolar transistor having a base, a collector, and an emitter, with the base coupled to the output terminal of $A_5$, the emitter coupled to $R_{10}$ and the inverting input terminal of $A_5$, and the collector electrically coupled to the receive path 302. However, it should be noted that those skilled in the art will be able to identify other suitable implementations for variable current device $Q_1$ that do not depart from the spirit and scope of the present invention. For example, $Q_1$ could also be implemented with an N-channel enhancement mode MOSFET transistor. Therefore, the present invention can be practiced with many types of variable current devices known to those skilled in the art, and any reference to a specific implementation is provided by way of example only.

The receive path 302 includes the transfer function F(s) 310 to provide the necessary filtering of the feedback signal fed back to the transmit path 301. A receive voltage signal $V_{RX}$ is present at the output of F(s) 310 and is coupled to $R_6$ of the first amplifier circuit 311 of the transmit path 301. The feedback loop extending from $Q_1$ through the receive path 302 to the transmit path 301 creates excess noise problems. These noise problems are attributable to the frequency response effects of amplifiers at the higher frequencies. Because network applications do not require impedance emulation at the higher frequencies, the transfer function F(s) 310 may be used to eliminate the amplitude and phase effects of the feedback signal at the high frequencies. While those skilled in the art will be able to identify other suitable circuit arrangements for F(s) 310 without departing from the scope of the present invention, the most preferred embodiment calls for a second order low pass filter in order to address both the phase and amplitude terms of the feedback signal.

Using standard circuit analysis techniques, one skilled in the art will be able to derive the following equations representative of the function of circuit 300:

$$I_T = \frac{V_{A4}}{R_{10}} \quad \text{(Equation 2)}$$

$$V_{A4} = \frac{-R_9}{Z_5} V_{A3} \quad \text{(Equation 3)}$$

$$V_{A3} = \frac{-R_7}{R_8} V_{TX} - \frac{R_7}{R_6} V_{RX} \quad \text{(Equation 4)}$$

$$V_{RX} = F(s) V_{IN} \quad \text{(Equation 5)}$$

$$I_T = \frac{1}{R_{10}} \left[ \frac{-R_9}{Z_5} \right] \left[ \frac{-R_7}{R_8} V_{TX} - \frac{R_7}{R_6} V_{RX} \right] \quad \text{(Equation 6)}$$

$$I_T = \frac{R_9}{R_{10}Z_5}\left[\frac{R_7}{R_8}V_{TX} + \frac{R_7}{R_6}F(s)V_{IN}\right] \quad \text{(Equation 7)}$$

[The output impedance $Z_O$ is derived by computing the part of $I_T$ caused only by $V_{IN}$]

$$Z_O = \frac{V_{IN}}{I_T}\bigg|_{V_{TX}=0} \quad \text{(Equation 8)}$$

$$Z_O = \frac{Z_5 R_6 R_{10}}{R_7 R_9 F(s)} \quad \text{(Equation 9)}$$

As can be seen from equation 9, the output impedance $Z_O$ can be set by the emulation impedance $Z_5$ multiplied by a clearly separable scale factor $R_6R_{10}/R_7R_9F(s)$. In contrast to the prior art circuit 200 of FIG. 2 as defined by equation 1, $Z_O$ in circuit 300 can be easily controlled to match the network impedance of the line side of the network. Furthermore, it should be noted that the physical location of $Z_5$ within the circuit topology is not limited to that shown in FIG. 3, but rather it is only necessary that $Z_5$ not be directly connected to $V_{IN}$ so that $Z_O$ can be remotely set by $Z_5$ away from the output terminal of the line side of the network.

It should also be noted that the above circuit relationships define $Z_O$ for circuit 300 in terms of ideal operational amplifiers having infinite gain properties. In view of this basic assumption, standard circuit analysis techniques can also be used to derive $Z_O$ for amplifiers having finite gain limitations. Accordingly, defining $Z_O$ to account for the frequency response effects of the amplifiers would yield the following circuit relationship:

$$Z_O = \left[\frac{Z_5 R_6 R_{10}}{R_7 R_9 F(s)}\right]\left[\left(\frac{1+A_5}{A_5}\right)\left(1+\frac{\left(1+\frac{R_9}{Z_5}\right)}{A_4}\right)\left(1+\frac{\left(1+\frac{R_7(R_6+R_8)}{R_6 R_8}\right)}{A_3}\right)\right] \quad \text{(Equation 10)}$$

where $$\left[\frac{Z_5 R_6 R_{10}}{R_7 R_9 F(s)}\right]$$

is equivalent to the value of $Z_O$ from equation 9 for ideal amplifiers, and $$\left[\left(\frac{1+A_5}{A_5}\right)\left(1+\frac{\left(1+\frac{R_9}{Z_5}\right)}{A_4}\right)\left(1+\frac{\left(1+\frac{R_7(R_6+R_8)}{R_6 R_8}\right)}{A_3}\right)\right]$$

represents the relationship of circuit elements that will contribute excess phase at frequencies approaching the unity gain frequency of the amplifiers. Accordingly, F(s) 310 must be designed to correct for amplifier gain and phase effects by attenuating the signal and/or correcting excess phase shift. This can be achieved with a second order low pass filter.

Based on the above relationships for $Z_O$ in equations 9 and 10, the first amplifier circuit 311 and the transfer function F(s) 310 are essential components for providing a "clean" representation of the output impedance $Z_O$.

Figure 4:
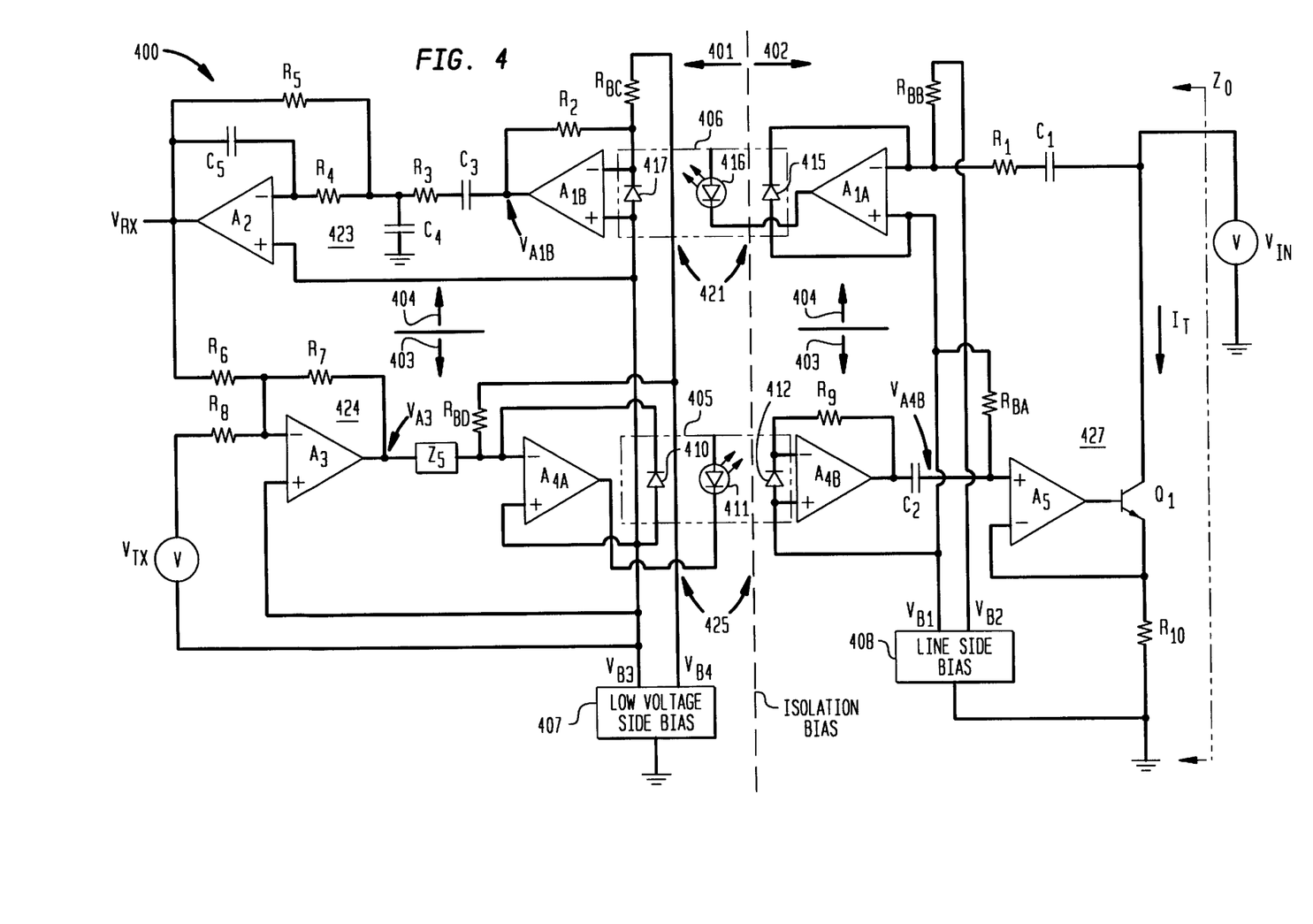
FIG. 4 is a schematic of an alternative embodiment wherein the extended feedback path includes high voltage interfaces to provide impedance matching across a high voltage boundary.

Referring now to FIG. 4, there is shown another exemplary embodiment of the present invention. Specifically, the network interface circuit 400 represents a practical implementation of circuit 300 (FIG. 3) for applications requiring impedance emulation across a high voltage boundary. Circuit 400 comprises the low voltage portion 401 and the line side portion 402. Both portions include the transmit path 403 and the receive path 404.

The transmit path 403 includes a first amplifier circuit 424 comprising an operational amplifier $A_3$, a first resistor $R_8$ coupled between an inverting input terminal of $A_3$ and a transmit voltage $V_{TX}$, a second resistor $R_7$ coupled between the inverting input terminal of $A_3$ and an output terminal of $A_3$, and a third resistor $R_6$ coupled to the inverting input terminal of $A_3$. A non-inverting input terminal of amplifier $A_3$ and the transmit voltage $V_{TX}$ are coupled to a low voltage side bias circuit 407. The transmit path 403 further includes a second amplifier circuit 425 which comprises a single extended operational amplifier having a first segment $A_{4A}$ operating on the low voltage portion 401 and a second segment $A_{4B}$ operating on the line side portion 402. The emulation impedance element $Z_5$ is coupled between the output terminal of amplifier $A_3$ and an inverting input terminal of first segment $A_{4A}$. A non-inverting input terminal of $A_{4A}$ is coupled to the low voltage side bias circuit 407. Second amplifier circuit 425 further includes a resistor $R_{BD}$ coupled between the inverting input terminal of first segment $A_{4A}$ and the low voltage side bias circuit 407, and a resistor $R_9$ coupled between an inverting input terminal and an output terminal of the second segment $A_{4B}$. A non-inverting input terminal of second segment $A_{4B}$ is coupled to a line side bias circuit 408. Second amplifier circuit 425 also includes a capacitor $C_2$ coupled to the output terminal of second segment $A_{4B}$. Transmit path 403 further includes a third amplifier circuit 427 comprising an operational amplifier $A_5$, a resistor $R_{BA}$ coupled between a non-inverting input terminal of $A_5$ and the line side bias circuit 408, a variable current device $Q_1$ coupled to an output terminal of $A_5$, and a resistor $R_{10}$ coupled to an output from variable current device $Q_1$. An inverting input terminal of $A_5$ is coupled to a junction between the output of $Q_1$ and $R_{10}$. $R_{10}$ is further coupled to the line side bias circuit 408 and to ground.

The receive path 404 includes a first amplifier circuit 421 comprising a single extended operational amplifier having a first segment $A_{1A}$ operating on the line side portion 402 and a second segment $A_{1B}$ operating on the low voltage portion 401, a capacitor $C_1$ coupled to variable current device $Q_1$, a resistor $R_1$ coupled between capacitor $C_1$ and an inverting input terminal of the first segment $A_{1A}$, and a resistor $R_{BB}$ coupled between the inverting input terminal of first segment $A_{1A}$ and the line side bias circuit 408. A non-inverting input terminal of $A_{1A}$ is also coupled to the line side bias circuit 408. The first amplifier circuit 421 further includes a resistor $R_2$ coupled between an inverting input terminal and an output terminal of the second segment $A_{1B}$, and a resistor $R_{BC}$ coupled between the inverting input terminal of the second segment $A_{1B}$ and the low voltage side bias circuit 407. A non-inverting input terminal of $A_{1B}$ is also coupled to the low voltage side bias circuit 407.

The receive path 404 also includes a second amplifier circuit 423 comprising an operational amplifier $A_2$, a first capacitor $C_5$ coupled between an inverting input terminal and an output terminal of $A_2$, a first resistor $R_4$ coupled to the inverting input terminal of $A_2$, a second resistor $R_3$ serially coupled to $R_4$, a third resistor $R_5$ coupled between the output terminal of $A_2$ and a junction between $R_3$ and $R_4$, a second capacitor $C_3$ coupled between the output terminal of the second segment $A_{1B}$ of the first amplifier circuit 421 and $R_3$ of the second amplifier circuit 423, and a third capacitor $C_4$ coupled between ground and the junction between $R_3$, $R_4$, and $R_5$. The second amplifier circuit 423 further includes a fourth capacitor $C_6$ coupled between the output terminal of $A_2$ and $R_6$ of the first amplifier circuit 424 of the transmit path 403. A receive voltage $V_{RX}$ is present at the output terminal of $A_2$. A non-inverting input terminal of $A_2$ is coupled to the low voltage side bias circuit 407.

The transfer function F(s) 310 of circuit 300 in FIG. 3 is implemented in circuit 400 of FIG. 4 with the operational amplifier $A_2$, resistors $R_3$, $R_4$, and $R_5$, and capacitors $C_3$, $C_4$, $C_5$, and $C_6$. In the most preferred embodiment, these elements function as a second order low pass filter to remove the high frequency signals present in the feedback loop extending from the variable current device $Q_1$ through the receive path 404. However, it should be noted that other suitable filter implementations known to those skilled in the art may be used without departing from the spirit and scope of the present invention.

The first and second high voltage interfaces 405 and 406 respectively, jointly define a high voltage isolation barrier at the high voltage boundary between the low voltage portion 401 and the line side portion 402. The first high voltage interface 405 is coupled between the first and second segments, $A_{4A}$ and $A_{4B}$ respectively, of the second amplifier circuit 425 in the transmit path 403. The second high voltage interface 406 is coupled between the first and second segments, $A_{1A}$ and $A_{1B}$ respectively, of the first amplifier circuit 421 in the receive path 404.

In one exemplary embodiment shown in FIG. 4, first and second high voltage interfaces 405 and 406 can be implemented using linear optical couplers (LOCs). It is noted that LOCs and their operation are well known in the art. Essentially, linear optical couplers are electrical-optical-electrical transducers which are useful to transmit an electric signal across an optically coupled isolation path. Optical signal transmission is useful when two systems need to exchange information, but are electrically incompatible, or require isolation, such as when one system operates at a higher voltage than a second system. U.S. Pat. Nos. 5,280, 526 and 5,528,685, each entitled "Transformerless Hybrid Circuit," each having a common inventor and the same assignee as the present invention, and each of which is hereby incorporated by reference, teach high voltage interface implementations which are relevant to the present invention.

An exemplary linear optical coupler (LOC) generally includes a light emitting diode (LED) light source and two photodiodes. Specifically, for circuit 400 in FIG. 4, the first high voltage interface (linear optical coupler) 405 in the transmit path 403 includes a first photodiode 410 coupled across the input terminals of the first operational amplifier segment $A_{4A}$, a light emitting diode (LED) 411 coupled to an output terminal of $A_{4A}$, and a second photodiode 412 coupled across the input terminals of the second operational amplifier segment $A_{4B}$. In operation, $A_{4A}$ functions as a driver amplifier to drive the LED 411, and $A_{4B}$ functions as a photodetector amplifier. Similarly, the second high voltage interface (linear optical coupler) 406 in the receive path 404 includes a first photodiode 415 coupled across the input terminals of the first operational amplifier segment $A_{1A}$, a LED 416 coupled to an output terminal of $A_{1A}$, and a second photodiode 417 coupled across the input terminals of the second operational amplifier segment $A_{1B}$. In operation, $A_{1A}$ functions as a driver amplifier to drive the LED 416, and $A_{1B}$ functions as a photodetector amplifier.

The operation of first and second high voltage interfaces 405 and 406 in conjunction with the extended feedback circuit loop provides voltage isolation between the low voltage portion 401 and the line side portion 402. Although linear optical couplers are particularly well suited for the present invention because of their isolation capabilities down to direct current (DC) levels, it will be apparent to one skilled in the art that other suitable implementations for the high voltage interface can be used without departing from the spirit and scope of the present invention.

In operation, the first amplifier circuit 424, the second amplifier circuit 425, and the third amplifier circuit 427 in the transmit path 403 provide gain for voltage signals $V_{TX}$, $V_{A3}$, and $V_{A4B}$ respectively. In one exemplary embodiment, the voltage signal in the second amplifier circuit 425 is optically coupled across the high voltage boundary by the first high voltage interface (linear optical coupler) 405. The variable current device $Q_1$ is responsive to the transmit signal from the third amplifier circuit 427. The extended feedback is provided in circuit 400 via the receive path 404, wherein the first amplifier circuit 421 of the receive path 404 is electrically coupled to $Q_1$ in the transmit path 403. The second high voltage interface (linear optical coupler) 406 optically couples the feedback signal across the high voltage boundary to the second amplifier circuit 423, which performs the transfer function F(s) 310 of FIG. 3. Ideally, the second amplifier circuit 423 functions as a second order low pass filter to remove the high frequency signals that are generated through the complex feedback loop. The output of the second amplifier circuit 423 is receive voltage signal $V_{RX}$ which is coupled through $C_6$ to the first amplifier circuit 424 of the transmit path 403 to complete the feedback loop. The low voltage side bias circuit 407 and the line side bias circuit 408 provide substantially invariant bias voltages to the various amplifier circuits of circuit 400. Specifically, the low voltage side bias circuit 407 generates bias voltages $V_{B3}$ and $V_{B4}$, and the line side bias circuit 408 generates bias voltages $V_{B1}$ and $V_{B2}$.

$Q_1$ can be a bipolar transistor having a base, an emitter, and a collector, with the base being coupled to the output terminal of $A_5$ and the emitter being coupled to $R_{10}$. However, the above discussion for circuit 300 (FIG. 3) regarding the use of other variable current devices is also applicable to circuit 400 in FIG. 4. Specifically, those skilled in the art will recognize that other types of variable current devices can be used without departing from the spirit and scope of the present invention. As such, the use of a bipolar transistor for $Q_1$ is described by way of example only.

Although the present invention is particularly well suited for use as an interface between user terminal equipment and a switched telephone network, and has been described with respect to this application, the circuit topologies disclosed herein can be applied to other network interface situations requiring isolation and impedance matching between the end user terminal equipment and the interconnected network.

Numerous modifications and alternative embodiments of the invention will be apparent to those skilled in the art in view of the foregoing description. Accordingly, this description is to be construed as illustrative only and is for the purpose of teaching those skilled in the art the best mode of carrying out the invention. Details of the structure may be varied substantially without departing from the spirit of the invention and the exclusive use of all modifications which come within the scope of the appended claims is reserved.

What is claimed is:

1. A network interface circuit for providing voltage isolation and impedance matching between a low voltage portion and a line side portion of a network, the network interface circuit comprising:
   a transmit path for coupling a voltage signal from the low voltage portion to the line side portion, said transmit path including an emulation impedance operating on the low voltage portion;
   a receive path for extending a feedback signal from an output of said transmit path on the line side portion to an input of said transmit path on the low voltage portion;
   a first high voltage interface in said transmit path for coupling said voltage signal across a high voltage boundary defined between the low voltage portion and the line side portion, said first high voltage interface being operable to electrically isolate said input of said transmit path and said output of said transmit path; and
   a second high voltage interface in said receive path for coupling said feedback signal across said high voltage boundary;
   wherein said emulation impedance is scalable to remotely set an output impedance across said high voltage boundary, said output impedance substantially matching a load impedance of the line side portion.

2. The network interface circuit according to claim 1, wherein said first and second high voltage interface jointly define a high voltage isolation barrier at said high voltage boundary, said high voltage isolation barrier being operable to provide voltage isolation between the low voltage portion and the line side portion.

3. The network interface circuit according to claim 2, wherein said first and second high voltage interfaces comprise a first and second linear optical coupler respectively.

4. The network interface circuit according to claim 3, wherein said transmit path further includes a first amplifier circuit operating on the low voltage portion, said first amplifier circuit being operable to provide a gain of said voltage signal applied to an input of said first amplifier circuit from the low voltage portion.

5. The network interface circuit according to claim 4, wherein said emulation impedance is coupled to an output of said first amplifier circuit, said emulation impedance being scalable to set said output impedance to substantially match said load impedance.

6. The network interface circuit according to claim 5, wherein said transmit path further comprises a second amplifier circuit including a single extended operational amplifier having a first and second segment, said first segment operating on the low voltage portion and said second segment operating on the line side portion, said first segment being coupled to said emulation impedance, said extended operational amplifier being operable to drive said first linear optical coupler.

7. The network interface circuit according to claim 6, wherein said transmit path further includes a third amplifier circuit operating on the line side portion, said third amplifier circuit being coupled to said second segment.

8. The network interface circuit according to claim 7, wherein said transmit path further includes a variable current device responsive to said voltage signal, said variable current device being operable to electrically couple said feedback signal from an output of said third amplifier circuit to said receive path.

9. The network interface circuit according to claim 8, wherein said receive path comprises a first amplifier circuit including a single extended operational amplifier having a first and second segment, said first segment operating on the line side portion and said second segment operating on the low voltage portion, said first segment being coupled to said variable current device, said extended operational amplifier in said receive path being operable to drive said second linear optical coupler.

10. The network interface circuit according to claim 9, wherein said receive path includes a second amplifier circuit operating on the low voltage portion, said second amplifier circuit coupled between said second segment in said receive path and said input of said first amplifier circuit in said transmit path.

11. The network interface circuit according to claim 10, wherein said second amplifier circuit in said receive path comprises a transfer function for correcting amplitude and phase effects of said feedback signal.

12. The network interface circuit according to claim 11, wherein said transfer function is a second order low pass filter for removing high frequency components from said feedback signal.

13. The network interface circuit according to claim 12, wherein said second order low pass filter comprises an operational amplifier, a first capacitor coupled between an inverting input terminal and an output terminal of said operational amplifier, a first resistor coupled to said inverting input terminal, a second resistor serially coupled to said first resistor, a third resistor coupled between said output terminal and a junction between said first and second resistor, a second capacitor serially coupled to said second resistor, a third capacitor coupled between said junction and a ground, and a fourth capacitor coupling said feedback signal from said output terminal of said operational amplifier to said first amplifier circuit in said transmit path.

14. The network interface circuit according to claim 9, wherein said second linear optical coupler comprises a first photodiode coupled across input terminals of said first segment in said receive path, a light emitting diode coupled to an output of said first segment, and a second photodiode coupled across input terminals of said second segment in said receive path, wherein said second linear optical coupler optically couples said feedback signal across said high voltage boundary from the line side portion to the low voltage portion.

15. The network interface circuit according to claim 11, wherein said first, second, and third amplifier circuits in said transmit path and said first and second amplifier circuits in said receive path are operational amplifier-based circuits.

16. The network interface circuit according to claim 15, wherein said first amplifier circuit in said transmit path comprises an operational amplifier, a first resistor coupled between said voltage signal and an inverting input terminal of said operational amplifier, a second resistor coupled between said inverting input terminal and an output terminal of said operational amplifier, and a third resistor coupled between said transfer function and said inverting input terminal of said operational amplifier.

17. The network interface circuit according to claim 15, wherein said third amplifier circuit in said transmit path comprises an operational amplifier, and a resistor coupled to an inverting input terminal of said operational amplifier and to said variable current device.

18. The network interface circuit according to claim 6, wherein said first linear optical coupler in said transmit path comprises a first photodiode coupled across input terminals of said first segment, a light emitting diode coupled to an output of said first segment, and a second photodiode coupled across input terminals of said second segment, wherein said first linear optical coupler optically couples said voltage signal across said high voltage boundary from the low voltage portion to the line side portion.

19. The network interface circuit according to claim 6, wherein said second amplifier circuit in said transmit path further includes a resistor coupled between an inverting input terminal and an output terminal of said second segment in said transmit path, and wherein said emulation impedance is coupled to an inverting input terminal of said first segment in said transmit path.

20. A network interface circuit for providing voltage isolation and impedance matching between a low voltage portion and a line side portion of a network, the network interface circuit comprising:
  a transmit path for coupling a voltage signal from the low voltage portion to the line side portion, said transmit path including
    a first amplifier circuit operating on the low voltage portion, said first amplifier circuit being operable to provide a gain of said voltage signal applied to an input of said first amplifier circuit from the low voltage portion, and
    an emulation impedance coupled to an output of said first amplifier circuit;
  a receive path for extending a feedback signal from an output of said transmit path on the line side portion to said input of said first amplifier circuit, said receive path including a transfer function for correcting amplitude and phase effects of said feedback signal;
  a first high voltage interface in said transmit path for coupling said voltage signal across a high voltage boundary defined between the low voltage portion and the line side portion, said first high voltage interface being operable to electrically isolate said input of said transmit path and said output of said transmit path; and
  a second high voltage interface in said receive path for coupling to said feedback signal across said high voltage boundary;
  wherein said emulation impedance is scalable to remotely set an output impedance across said high voltage boundary, said output impedance substantially matching a load impedance of the line side portion.

21. The network interface circuit according to claim 20, wherein said transfer function is a second order low pass filter for removing high frequency components from said extended feedback signal.

22. A network interface circuit for matching a load impedance of a network, the network interface circuit comprising:
  a first amplifier circuit having an input coupled to an applied voltage signal, said first amplifier circuit being operable to provide a gain of said applied voltage signal through a transmit path and being operable to electrically isolate said input and an output terminal for coupling to the network;
  an emulation impedance coupled between an output of said first amplifier circuit and the output terminal for coupling to the network; and
  an extended feedback circuit coupled between said emulation impedance and said input to said first amplifier circuit,
  wherein said emulation impedance is scalable to set an output impedance at said output terminal, said output impedance substantially matching the load impedance of a network;
  wherein said extended feedback circuit includes a transfer function for correcting amplitude and phase effects of said first amplifier circuit; and
  wherein said transfer function is a second order low pass filter for removing high frequency signals within said extended feedback circuit.

23. A network interface circuit for matching a load impedance of a network, the network interface circuit comprising:
  a first amplifier circuit having an input coupled to an applied voltage signal, said first amplifier circuit being operable to provide a gain of said applied voltage signal through a transmit path and being operable to electrically isolate said input and an output terminal for coupling to the network;
  an emulation impedance coupled between an output of said first amplifier circuit and the output terminal for coupling to the network;
  an extended feedback circuit coupled between said emulation impedance and said input to said first amplifier circuit; and
  a second amplifier circuit and a third amplifier circuit, wherein said second amplifier circuit is coupled between said emulation impedance and said third amplifier circuit, and said third amplifier circuit is coupled to said extended feedback circuit;
  wherein said emulation impedance is scalable to set an output impedance at said output terminal, said output impedance substantially matching the load impedance of a network;
  wherein said first amplifier circuit includes a first operational amplifier, said second amplifier circuit includes a second operational amplifier, and said third amplifier circuit includes a third operational amplifier; and
  wherein said second amplifier circuit further includes a resistor coupled between an inverting input terminal and an output terminal of said second operational amplifier, said emulation impedance being coupled to said inverting input terminal of said second operational amplifier, and wherein said output terminal of said second operational amplifier is coupled to a non-inverting input of said third operational amplifier.

24. An interface circuit for matching a load impedance of a network, the interface circuit comprising:
  a first amplifier circuit operable to provide a gain of a voltage signal applied to said first amplifier circuit and operable to electrically isolate an input terminal coupled to said applied voltage signal and an output terminal for coupling to the network;
  a second amplifier circuit;
  an emulation impedance coupled between said first and second amplifier circuits;
  a third amplifier circuit coupled to an output of said second amplifier circuit;
  a variable current device responsive to a signal from an output of said third amplifier circuit;
  an extended feedback circuit coupled between said variable current device and an input to said first amplifier circuit;
  wherein said emulation impedance is scalable by circuit terms from said first, second, and third amplifier circuits to set an output impedance, said output impedance substantially matching the load impedance of the network;

wherein said first amplifier circuit includes a first operational amplifier, said second amplifier circuit includes a second operational amplifier, and said third amplifier circuit includes a third operational amplifier;

wherein said extended feedback circuit includes a transfer function for correcting amplitude and phase effects of said first, second, and third operational amplifiers; and wherein said transfer function is a second order low pass filter for removing high frequency signals within said extended feedback circuit.

25. An interface circuit for matching a load impedance of a network, the interface circuit comprising:

a first amplifier circuit operable to provide a gain of a voltage signal applied to said first amplifier circuit and operable to electrically isolate an input terminal coupled to said applied voltage signal and an output terminal for coupling to the network;

a second amplifier circuit;

an emulation impedance coupled between said first and second amplifier circuits;

a third amplifier circuit coupled to an output of said second amplifier circuit;

a variable current device responsive to a signal from an output of said third amplifier circuit;

an extended feedback circuit coupled between said variable current device and an input to said first amplifier circuit;

wherein said emulation impedance is scalable by circuit terms from said first, second, and third amplifier circuits to set an output impedance, said output impedance substantially matching the load impedance of the network;

wherein said first amplifier circuit includes a first operational amplifier, said second amplifier circuit includes a second operational amplifier, and said third amplifier circuit includes a third operational amplifier;

wherein said extended feedback circuit includes a transfer function for correcting amplitude and phase effects of said first, second, and third operational amplifiers;

wherein said first amplifier circuit further includes a first resistor coupled between said voltage signal and an inverting input terminal of said first operational amplifier, a second resistor coupled between said inverting input terminal and an output terminal of said first operational amplifier, and a third resistor coupled between said transfer function and said inverting input terminal of said first operational amplifier; and wherein said second amplifier circuit further includes a resistor coupled between an inverting input terminal and an output terminal of said second operational amplifier, and wherein said emulation impedance is coupled to said inverting input terminal of said second operational amplifier.

* * * * *